(12) United States Patent
Palermo et al.

(10) Patent No.: US 9,698,335 B2
(45) Date of Patent: Jul. 4, 2017

(54) PIEZOELECTRIC ACTUATING DEVICE AND VALVE EQUIPPED THEREWITH

(71) Applicant: FESTO AG & Co. KG, Esslingen (DE)

(72) Inventors: Gino Palermo, Donzdorf (DE); Jens Anderle, Eislingen (DE); Hannes Wirtl, Schongau (DE); Gerd Hoitz, Schlat (DE)

(73) Assignee: FESTO AG & CO. KG, Esslingen (DE)

( * ) Notice: Subject to any disclaimer, the term of this patent is extended or adjusted under 35 U.S.C. 154(b) by 46 days.

(21) Appl. No.: 14/895,393

(22) PCT Filed: May 22, 2014

(86) PCT No.: PCT/EP2014/001376
§ 371 (c)(1),
(2) Date: Dec. 2, 2015

(87) PCT Pub. No.: WO2014/194986
PCT Pub. Date: Dec. 11, 2014

(65) Prior Publication Data
US 2016/0118573 A1 Apr. 28, 2016

(30) Foreign Application Priority Data

Jun. 8, 2013 (DE) ........................ 10 2013 009 646

(51) Int. Cl.
*H01L 41/09* (2006.01)
*F16K 31/00* (2006.01)
(Continued)

(52) U.S. Cl.
CPC ............ *H01L 41/09* (2013.01); *F16K 31/005* (2013.01); *F16K 31/007* (2013.01);
(Continued)

(58) Field of Classification Search
CPC ..... H01L 41/09; H01L 41/042; H01L 41/094; H01L 41/047; H01L 41/0913;
(Continued)

(56) References Cited

U.S. PATENT DOCUMENTS 3,760,203 A * 9/1973 Guntersdorfer ....... H01L 41/042
310/331
4,670,682 A * 6/1987 Harnden, Jr. .......... H01H 57/00
310/358

(Continued)

FOREIGN PATENT DOCUMENTS

DE 202005006126 8/2005
EP 1427031 5/2013
(Continued)

*Primary Examiner* — John Bastianelli
(74) *Attorney, Agent, or Firm* — Hoffmann & Baron, LLP

(57) ABSTRACT

A piezoelectric actuator device, with at least one piezoelectric transducer which has at least one piezoelectric body and an electrode unit assigned to this piezoelectric body, with overall capacitance and including two electrodes lying opposite one another. At least one of the two electrodes of the electrode unit is divided into several individual sub-electrodes, spaced apart from one another and forming with the electrode lying opposite several sub-electrode pairs defining in each case a partial capacitance of the overall capacitance. A separate current-limiting resistor active during charge flow is connected in series to each sub-electrode pair. A valve, for controlling a fluid, is equipped with such an actuator device.

30 Claims, 2 Drawing Sheets

(51) Int. Cl.
*H01L 41/04* (2006.01)
*H01L 41/047* (2006.01)

(52) U.S. Cl.
CPC .......... *H01L 41/042* (2013.01); *H01L 41/047* (2013.01); *H01L 41/094* (2013.01); *H01L 41/0906* (2013.01)

(58) Field of Classification Search
CPC . H01L 41/0906; F16K 31/007; F16K 31/005; F16K 31/006
USPC ............ 251/129.06; 310/311, 331, 345, 348, 310/365, 366, 368
See application file for complete search history.

(56) References Cited

U.S. PATENT DOCUMENTS

| | | | |
|---|---|---|---|
| 5,361,013 A * | 11/1994 | Wiget | H01L 41/042 310/316.01 |
| 6,876,135 B2 * | 4/2005 | Pelrine | H01L 41/042 310/317 |
| 7,084,549 B2 * | 8/2006 | Watanabe | H02N 2/067 310/317 |
| 2006/0012937 A1 * | 1/2006 | Watanabe | H02N 2/0075 361/160 |
| 2011/0057543 A1 | 3/2011 | Adachi | |

FOREIGN PATENT DOCUMENTS

| | | |
|---|---|---|
| JP | 2005051840 | 2/2005 |
| WO | WO02089160 | 11/2002 |

* cited by examiner

PIEZOELECTRIC ACTUATING DEVICE AND VALVE EQUIPPED THEREWITH

This application claims priority based on an International Application filed under the Patent Cooperation Treaty, PCT/EP2014/001376, filed May 22, 2014, which claims priority to DE102013009646.4, filed on Jun. 8, 2013.

BACKGROUND OF THE INVENTION

The invention relates to a piezoelectric actuator device with at least one piezoelectric transducer which has at least one piezoelectric body and an electrode unit assigned to this piezoelectric body with overall capacitance and comprised of two electrodes mounted on opposite sides of the piezoelectric body.

The invention also relates to a valve for controlling a fluid, equipped with such a piezoelectric actuator device and in which the piezoelectric transducer forms a valve member or a drive element for a valve member.

A piezoelectric actuator device of this type known from DE 20 2005 006 126 U1 contains a piezoelectric transducer designed as bending actuator with a piezoelectric body composed of piezoelectrically active material and two electrodes flanking the piezoelectric body on opposite long sides and together forming an electrode unit which has an overall capacitance determined by the base area of the electrodes. In operation of the piezoelectric actuator device, a drive voltage is applied to the electrode unit, resulting in a charge inflow to the two electrodes which leads among other things to a change in length of the piezoelectric body. Since the piezoelectric body is placed on a piezoelectrically inactive substrate, the change in length of the piezoelectric body results in a bending of the bending actuator, which may be used for example to actuate a valve.

The piezoelectric transducer of the type according to the invention may also be designed as a stack actuator which has several piezoelectric bodies mounted one above the other and each flanked by an electrode unit. Here in particular a change in thickness of the piezoelectric bodies resulting from the inverse piezoelectric effect may be used for actuation purposes.

WO 02/089160 A2 describes a piezoelectric transducer with a so-called multi-layer structure, in which thin piezoelectric body layers alternating with electrodes are mounted on top of one another in layers, which has the advantage that acceptable elongations of the piezoelectric material and accordingly appreciable deformations of the piezoelectric transducer may be obtained with relative low drive voltages.

Known from US 2011/0057543 A1 is a vibration drive which has an actuator body comprised of a stack arrangement of piezoelectric layers and internal positive and negative electrode layers. Each electrode layer consists of several divided electrodes, so that positive and negative electrodes lie opposite in pairs which may be driven electrically in a variable manner in order to deform the actuator body at high frequency and to generate vibrations which may be used to shift a movably mounted element to and fro. Each electrode pair is connected to a separate voltage source with an interposed coil.

In principle, the obtainable elongation of a piezoelectric body and the resulting mechanical lifting work of the assigned piezoelectric transducer is dependent on the applied drive voltage. In particular for applications which require a certain degree of explosion protection and the observance of associated standards, however, there are limits to the use of high drive voltages. High drive voltages lead to high currents during the inflow and outflow of the charges to and from the electrodes which, in an applicable environment, may lead to dangerous explosions caused by sparkover. To avoid this, a piezoelectric transducer in an applicable environment may be operated only in so-called intrinsically safe mode and moreover only with limited drive voltage. This has an adverse effect on the mechanical lifting work achievable in operation. If a piezoelectric transducer is used for example as an actuator for valve operation, it generally leads to a limit to the controllable rates of flow.

SUMMARY OF THE INVENTION

The invention is based on the problem of creating a piezoelectric actuator device which may be operated with a high level of efficiency while observing explosion protection regulations.

This problem is solved by a piezoelectric actuator device and also by a valve equipped with such a device by providing that at least one of the two electrodes of the electrode unit is divided into several individual sub-electrodes, spaced apart from one another and forming with the electrode lying opposite several sub-electrode pairs defining in each case a partial capacitance of the overall capacitance, wherein a separate current-limiting resistor which is active during the flow of charge is connected in series to each sub-electrode pair.

The invention is based on the concept of splitting the overall capacitance of an electrode unit assigned to a piezoelectric body into several partial capacitances which are smaller than the overall capacitance, and assigning each partial capacitance to limit the current strengths occurring during charge flow of a series resistor which may be described as a current-limiting resistor. Since the sub-electrodes are spaced apart from one another for this purpose, an intrinsically safe circuit may be ensured for each partial capacitance.

During operation of piezoelectric transducers in an explosion-protected environment, so-called ignition limit curves are generally to be observed, according to which the permissible drive voltage falls with increasing capacitance. Basically, though, a high drive voltage is sought, in order to obtain the maximum possible charge density of the electrode unit, and accordingly to be able to perform a high level of mechanical lifting work. The invention makes allowance for this balancing act by providing that the overall capacitance assigned to the piezoelectric body is formed not only by a pair of suitably large electrodes, but is based as it were on a splitting of at least one large electrode into several smaller sub-electrodes which are arranged next to one another, each forming with the opposite counter-electrode a sub-electrode pair with a capacitance described as partial capacitance which is less than the overall capacitance, while the overall capacitance is made up of the total available partial capacitances. The smaller partial capacitances may be operated in an acceptable manner with higher drive voltages than a large capacitance, so that altogether a greater charge may be applied to the electrode unit than for a single large electrode pair. Since all partial capacitances are mechanically interconnected via the assigned piezoelectric body, which is preferably a single part and in particular one piece, the piezoelectric unit composed of the sub-electrode pairs and the piezoelectric body behaves like a conventional piezoelectric transducer, which is flanked on both sides by, in each case, a single electrode. The current-limiting resistors connected in series with the sub-electrode pairs ensure that current strength during charge flow does not exceed an acceptable level, while the accompanying slightly higher time constant until full charging of the sub-electrode pairs is very small and has no appreciable effect on operating behaviour. Since the piezoelectric transducer according to the invention as a rule makes no further demands on the drive electronics, apart from the additional resistors and the higher drive voltage, it is possible to ensure universal use in virtually all cases in which piezoelectric transducers of formerly conventional design are used.

The principle according to the invention may be applied to piezoelectric transducers of any desired type. Only by way of example is reference made to applications such as monomorphic piezoelectric transducers, trimorphic piezoelectric bending actuators and/or bending actuators with multi-layer structure. Moreover, the principle according to the invention is suitable in particular for both bending actuators and stack actuators.

Advantageous developments of the invention are disclosed in the dependent claims.

In an especially cost-effective design it is provided that only one of the two electrodes of an electrode unit assigned to a piezoelectric body is divided into several individual sub-electrodes, spaced apart from one another, while the electrode lying on the other side of the piezoelectric body is made as a unitary, i.e. coherent and in particular one-piece electrode. Here then, the electrode sections of the unitary electrode lying opposite the individual sub-electrodes form the sub-electrodes provided on this side.

If the piezoelectric body, in connection with a suitable design of piezoelectric transducer, is mounted on a piezoelectrically inactive substrate, there is the advantageous possibility of using an electrically conductive substrate which may then be used directly as the unitary electrode.

The effect according to the invention may however also be obtained advantageously when both electrodes of the electrode unit are divided into several individual sub-electrodes, spaced apart, so that individual sub-electrodes of both electrodes lie opposite in pairs to form individual sub-electrode pairs. In this connection it is advantageous for the number of sub-electrodes present on both sides of the piezoelectric body to be the same, with each individual sub-electrode on one side lying opposite a single individual sub-electrode of the other side.

It is also advantageous if the individual sub-electrodes lying opposite and forming an individual sub-electrode pair are in each case of equal size as far as the electrode surface is concerned.

Expediently the individual sub-electrodes belonging to the same respective electrode are arranged in a common plane.

In a preferred design, the individual sub-electrodes are strip-shaped and arranged longitudinally adjacent to one another with lateral clearance. This is especially expedient in the case of a piezoelectric transducer in the form of an elongated bending actuator, wherein then the individual sub-electrodes are arranged in particular transversely to the longitudinal direction of the bending actuator, with clearance from one another.

Success according to the invention occurs however with any desired pattern of distribution. So for example in the case of a bending actuator with an elongated shape, several sub-electrode pairs may also be arranged consecutively in the longitudinal direction of the bending actuator, with clearance from one another.

As mentioned above, in particular when the piezoelectric transducer is designed as a bending actuator, the piezoelectric body is mounted on a substrate which is piezoelectrically inactive and preferably spring-elastic. This substrate may, if it is electrically conductive, form a unitary electrode of the electrode unit, which works section by section with individual sub-electrodes on the opposite side of the piezoelectric body to form partial capacitances.

Preferably each sub-electrode pair is contacted by a separate electrical supply lead serving for charge transfer and containing the assigned current-limiting resistor connected in series.

A preferred variant of the piezoelectric actuator device contains, besides the at least one piezoelectric transducer, a voltage source to provide a drive voltage allowing actuation of the piezoelectric bending actuator or actuators and which is or may be connected simultaneously to all sub-electrode pairs.

BRIEF DESCRIPTION OF THE DRAWINGS

The invention is explained in detail below with the aid of the appended drawing, which shows in.

DETAILED DESCRIPTION OF THE PREFERRED EMBODIMENTS

Figure 1:
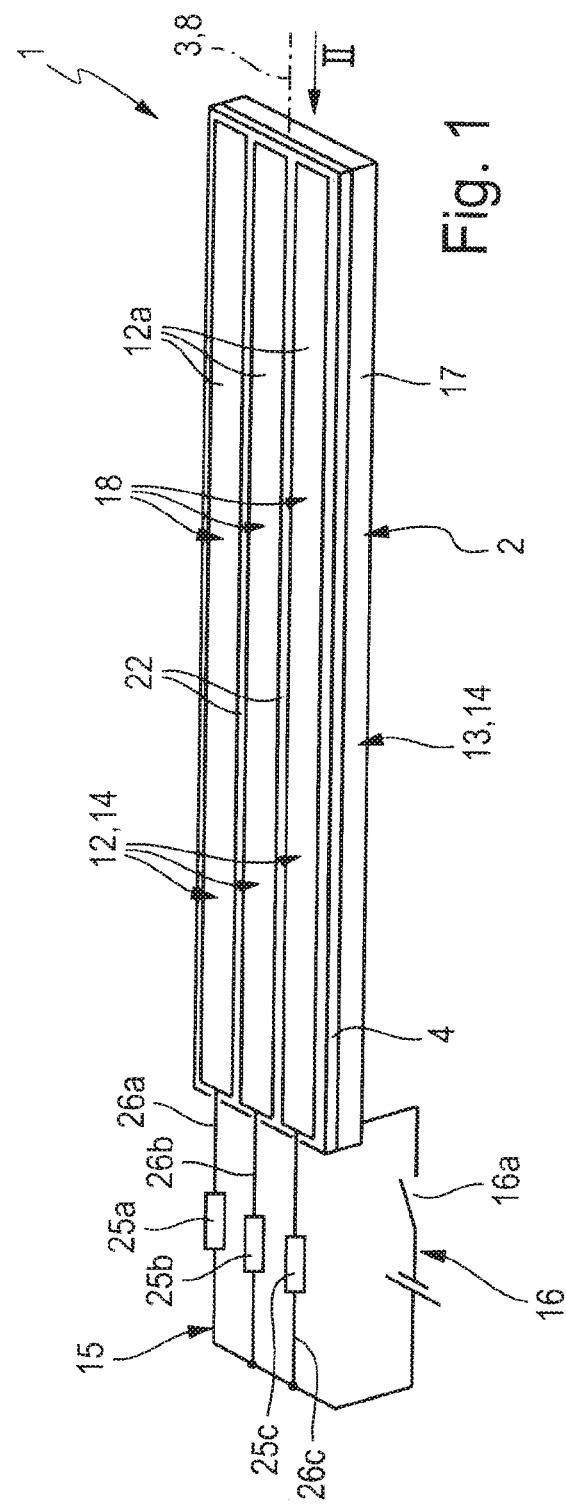
FIG. 1 a preferred embodiment of the piezoelectric actuator device in a schematic isometric view FIG. 2 another view of the actuator device of FIG. 1, looking in accordance with arrow II on to an end face of the piezoelectric transducer, and FIG. 3 a further embodiment of the piezoelectric actuator device in a view corresponding to FIG. 2.

The piezoelectric actuator device designated in its totality by reference number 1 contains at least one and in both embodiments exactly one piezoelectric transducer 2, which is able to convert electrical energy into mechanical energy. The piezoelectric transducer 2 may for example be used as an actuator for the actuation of any desired equipment. An advantageous application is that of use in a valve serving to control a fluid and there directly as a valve member or as drive element for a valve member.

Expediently, in an application as a valve, the valve member formed or driven by the piezoelectric transducer 2 may be moved by actuation of the piezoelectric transducer 2, in order to interact with at least one valve seat, and by this means influence the flow of a fluid. Preferably the valve seat frames the mouth of a valve passage which is closed when the valve member fits up against the valve seat, and which is open when the valve member is lifted from the valve seat. The valve seat is expediently provided on a valve casing of the valve, which defines a valve chamber into which the valve member extends, wherein the valve member may be moved relative to the valve casing by actuation of the piezoelectric transducer 2, at least in certain areas, in order to change its relative position with respect to the valve seat.

In respect of the invention, the shape of the piezoelectric transducer 2 is basically irrelevant. In the embodiment it has an elongated shape with a longitudinal axis 3. Varying from this, it may also be plate-shaped or disc-shaped in design.

The drawing also illustrates a piezoelectric transducer 2, preferably in the form of a bending actuator. The invention may however also be applied to other types of piezoelectric transducer, for example to so-called stack actuators.

The piezoelectric transducer 2 has at least one piezoelectric body 4 made of a piezoelectrically active material and in particular a piezoelectric ceramic. This piezoelectric body 4 is strip-shaped in the embodiments, but could also be plate-shaped or disc-shaped, depending on the type of piezoelectric transducer 2.

The piezoelectric body 4 has two large surfaces, facing away from and aligned opposite to one another, which are described below for better distinction as top side 5 and bottom side 6, which is not intended to indicate any limitation. The piezoelectric transducer 2 may be operated perfectly well with any desired alignment of the top side 5 and the bottom side 6.

The piezoelectric body 4 has a main extension plane 7, relative to which the top side 5 and bottom side 6 run parallel. By way of example, the strip-shaped piezoelectric body 4 has a longitudinal axis 8 with identical orientation to the longitudinal axis 3 of the piezoelectric transducer 2, and running parallel to the main extension plane 7.

The piezoelectric body 4 is mounted in sandwich fashion between two electrodes 12, 13, described below for better distinction as first and second electrodes 12, 13. The first electrode 12 is assigned to the top side 5, and the second electrode 13 to the bottom side 6. Each electrode 12, 13 is made of an electrically conductive material.

Preferably at least one and expediently each electrode 12, 13 is applied directly to the piezoelectric body 4. In the embodiment, the first electrode 12 is fixed to the top side 5 and the second electrode 13 to the bottom side 6. At least one of the two electrodes 12, 13 may be applied to the piezoelectric body 4 as metallization.

The two electrodes 12, 13 together form an electrode unit 14, which defines a certain charge capacitance described as overall capacitance. Via an electrical conductor layout 15, which expediently belongs to the piezoelectric actuator device 1, the two electrodes 12, 13 are or may be connected to a voltage source 16 which preferably similarly belongs to the piezoelectric actuator device 1. By way of example this involves a switchable voltage source with suitable switching means 16a which allow either the application of a drive voltage to the electrode unit 14 or disconnection from the electrode unit 14. Expediently, electrical and/or electronic switching means, not yet shown in detail, are also assigned to the voltage source 16 and form in particular drive electronics which, as required, are also able to generate a charge flow from the electrode unit 14, in order to discharge the overall capacitance.

When a drive voltage is applied to the electrode unit 14, charges flow to the two electrodes 12, 13 and generate between the two electrodes 12, 13 an electrical field 19, indicated by double arrows and passing through the piezoelectric body 4 transversely to its main extension plane 7. This leads, in accordance with the inverse piezoelectric effect, to a change in shape of the piezoelectric body 4, which in the embodiment also results in particular in a deformation in the longitudinal direction 8.

This in turn leads in both embodiments to a bending of the piezoelectric transducer 2 at right-angles to the main extension plane 7.

The bending behaviour of the piezoelectric transducer 2 results in the case of both embodiments from the fact that the piezoelectric body 4 is fastened by its bottom side 6 to a piezoelectrically inactive substrate 17, which cannot accompany the extension in length of the piezoelectric body 4. It is made preferably from a spring-elastic material, for example metal, plastic or a composite material. Preferably it is designed like the piezoelectric body 4 and is therefore, in the embodiment, strip-shaped.

The substrate 17 compensates for the extension in length of the piezoelectric body 4 by warping. This leads altogether to the already mentioned sagging of the piezoelectric transducer 2 while energised.

If the piezoelectric transducer 2 is in the form of a stack actuator, then the substrate 17 is generally dispensed with. In this case several piezoelectric bodies 4 are stacked on top of one another at right-angles to the main extension plane 7, in each case alternating with an electrode. In this way, once again each piezoelectric body 4 is flanked by two electrodes 12, 13 forming an electrode unit 14, wherein however each electrode arranged between two piezoelectric bodies 4 simultaneously forms an electrode of two adjacent electrode units 14. This also applies incidentally to the piezoelectric transducer 2, which has a piezoelectrically active section provided in a so-called multi-layer structure, and is composed of several alternating stacked piezoelectric bodies 4 and electrodes 12, 13.

An advantageous effect results for all embodiments of the piezoelectric actuator device 1 shown and referred to from the fact that the electrode unit 14 is divided into several sub-electrode pairs 18, all mechanically and in particular permanently connected to the piezoelectric body 4. Each of these several sub-electrode pairs 18, which are expediently electrically insulated from one another on the piezoelectric body 4, defines a charge capacitance which is less than the overall capacitance referred to above and is therefore described as partial capacitance. The total of the partial capacitances of the several sub-electrode pairs 18 provided gives the overall capacitance of the electrode unit 14.

In each of the embodiments shown, three sub-electrode pairs 18 are provided. The effect according to the invention occurs however even with only two sub-electrode pairs 18. There is also no problem in equipping the piezoelectric body with more than three sub-electrode pairs 18.

The sub-electrode pairs 18 result from the fact that at least one of the two electrodes 12, 13 is divided into several individual partial electrodes or sub-electrodes 12a, 13a which, with the other respectively opposite electrode, form a partial electrode pair or sub-electrode pair 18. The sub-electrodes 12a or 13a belonging to the same electrode 12 or 13 are preferably electrically insulated from one another.

For each electrode 12, 13, the individual sub-electrodes 12a, 13a lie expediently in the main extension plane 7 with clearance from one another. Individual sub-electrodes 12a, 13a belonging to the same electrode 12 or 13 lie preferably in a common plane.

The space 22 between adjacent sub-electrodes 12a, 13a of the same electrode 12, 13 is sufficiently large to rule out the occurrence of leakage currents or spark-over in operation. The space 22 may be filled with air or filled up with an electrically non-conductive material. The clearance between adjacent sub-electrodes 12a, 13a of the same electrode 12, 13 is in each case large enough to ensure intrinsic safety as specified in the relevant explosion-protection standards.

Figure 3:
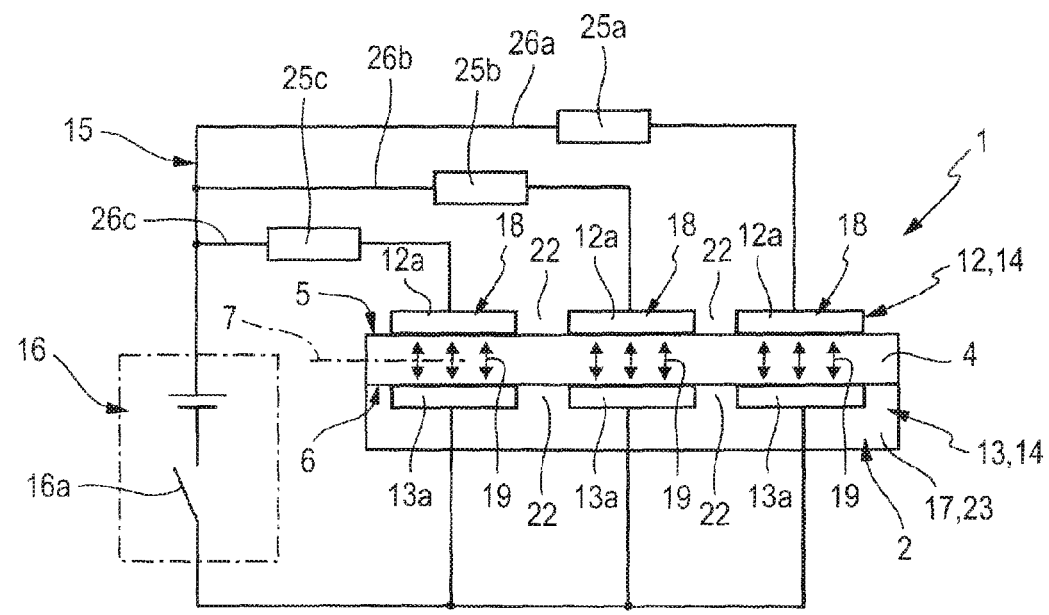

In the embodiment of FIG. 3, both electrodes 12, 13 of the electrode unit 14 are divided into several individual sub-electrodes 12a, 13a, spaced apart from one another. At the same time, individual sub-electrodes 12a, 13a of both electrodes 12, 13 lie opposite one another to form sub-electrode pairs 18, paired in the direction of thickness of the piezoelectric body 4, i.e. at right-angles to the main extension plane 7.

Preferably the electrode unit 14 contains an equal number of individual sub-electrodes 12a and 13a. In this connection, each individual sub-electrode 12a of the one electrode 12 lies opposite an individual sub-electrode 13a of the other electrode 13. The opposing sub-electrodes 12a, 13a are expediently the same size and have in particular the same outline, so that they cover one another when the piezoelectric transducer 2 is viewed in the direction of the thickness of the piezoelectric body 4.

Even when the sub-electrodes 12a, 13a belonging to the same sub-electrode pair 18 are of equal size, there is still the option of varying the size of the sub-electrodes 12a, 13a involving several sub-electrode pairs 18. Thus for example the base area of the sub-electrodes 12a, 13a of a first sub-electrode pair 18 may be larger than the base area of the sub-electrodes 12a, 13a of at least one other sub-electrode pair 18.

Figure 2:
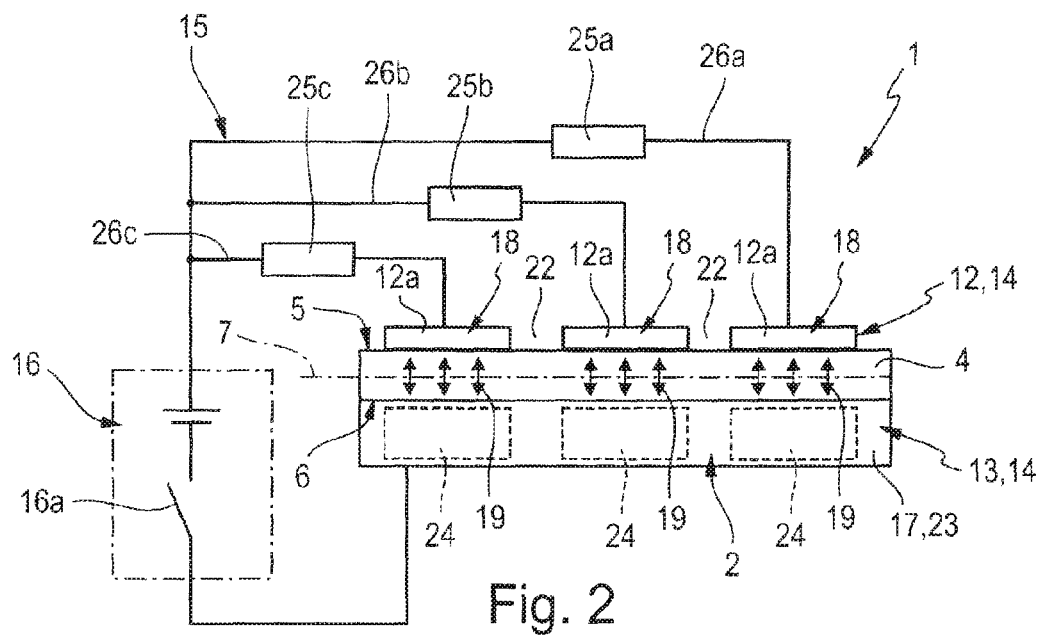

In the embodiment illustrated in FIGS. 1 and 2, only the first electrode 12 is comprised of several individual sub-electrodes 12a, 13a. The second electrode 13, on the other hand, is in the form of a unitary electrode 23, which has no subdivision and has in particular a cohesive two-dimensional extent, which is preferably at least as large as the total of the base areas of the individual sub-electrodes 12a arranged on the other side, and the spaces 22 assigned to them.

In this case, each sub-electrode pair 18 is formed by one of the individual sub-electrodes 12a of the one electrode 12 and the electrode section 24 of the unitary electrode 23 lying opposite this individual sub-electrode 12a, indicated by a dotted line in FIG. 2. This structure has the advantage of being especially easy to produce, since the provision of individual sub-electrodes is unnecessary on one side of the piezoelectric body 4.

It is advantageous if the piezoelectrically inactive substrate 17, where provided, is electrically conductive, since this substrate 17 itself may then be used as unitary electrode 23. In this case there is no need for the separate application of a corresponding electrode. This is the case in the embodiment of FIGS. 1 and 2.

There is however no problem in providing the second electrode 13 in addition to the piezoelectrically inactive substrate 17. Such a design is provided in the embodiment of FIG. 3. In this case, the second electrode 13 is expediently fitted between the piezoelectric body 4 and the piezoelectrically inactive substrate 17. This design is especially useful when the second electrode 13, like the first electrode 12, is provided in the form of several individual sub-electrodes 13a.

The piezoelectric body 4 is expediently a single unit and in particular made as a single piece.

In particular in connection with a piezoelectric transducer 2 designed as a bending actuator it is expedient to have several and in particular all sub-electrodes 12a, 13a in elongated strip form, and to mount them on the piezoelectric body 4 so that they extend axially along its longitudinal axis 8 and are arranged on the long side, next to one another, with lateral clearance. This applies to both embodiments.

Connected in series to each sub-electrode pair 18 is a separate current-limiting resistor 25a, 25b, 25c so that each current-limiting resistor 25a, 25b, 25c, in particular during charge inflow to the sub-electrode pairs 18, but preferably also during charge outflow from these sub-electrode pairs 18, has an electric current flowing through it. In this way, for each partial capacitance, current strength is limited to a level which allows the piezoelectric actuator device 1 also to be used in explosion-risk areas. Each of the current-limiting resistors 25a, 25b, 25c is a purely ohmic resistor. One may therefore also speak of a resistive current limitation. The resistance value for each current-limiting resistor 25a, 25b, 25c is expediently several kilo-ohms.

By way of example, each sub-electrode pair 18 is contacted by an electrical supply lead 26a, 26b, 26c serving for the electrical charge transfer. Connected into the supply lead, which is a part of the electrical conductor layout 15 mentioned above, is the assigned current-limiting resistor 25a, 25b, 25c. These electrical supply leads 26a, 26b, 26c are expediently connected together to the voltage source 16. Consequently, all sub-electrode pairs 18 are connected to the same voltage source 16. Since the voltage source 16 is switchable, it is possible for all sub-electrode pairs 18 to be connected to or disconnected from the drive voltage simultaneously. The actuator device 1 is preferably operated in such a way that in each case the same drive voltage is applied to all sub-electrode pairs 18 simultaneously.

The invention claimed is:

1. A piezoelectric actuator device, with at least one piezoelectric transducer which has at least one piezoelectric body and an electrode unit assigned to this piezoelectric body, wherein the electrode unit comprises two electrodes mounted on opposite sides of the piezoelectric body and has an overall capacitance, wherein at least one of the two electrodes of the electrode unit is divided into several individual sub-electrodes spaced apart from one another and forming, with the electrode lying opposite, several sub-electrode pairs each defining a partial capacitance of the overall capacitance, wherein a separate current-limiting resistor active during charge flow is connected in series to each sub-electrode pair.

2. A piezoelectric actuator device according to claim 1, wherein only one of the two electrodes of the electrode unit is divided into several individual sub-electrodes, spaced apart from one another, while the other electrode lying opposite is a unitary electrode and electrode sections of the unitary electrode lying opposite the individual sub-electrodes contribute to forming a sub-electrode pair in each case.

3. A piezoelectric actuator device according to claim 1, wherein both electrodes of the electrode unit are divided into several individual sub-electrodes, spaced apart from one another, wherein individual sub-electrodes of both electrodes lie opposite in pairs to form sub-electrode pairs.

4. A piezoelectric actuator device according to claim 3, wherein the two electrodes are divided into an equal number of individual sub-electrodes, wherein each individual sub-electrode of the one electrode lies opposite an individual sub-electrode of the other electrode to form a sub-electrode pair.

5. A piezoelectric actuator device according to claim 3, wherein the individual sub-electrodes lying opposite one another to form a sub-electrode pair are in each case of equal size.

6. A piezoelectric actuator device according to claim 1, wherein the individual sub-electrodes belonging to the same electrode lie in a common plane.

7. A piezoelectric actuator device according to claim 1, wherein the individual sub-electrodes of each electrode divided into individual sub-electrodes are strip-shaped and arranged next to one another on the long side and with lateral clearance.

8. A piezoelectric actuator device according to claim 1, wherein the piezoelectric transducer is in the form of a bending actuator with an elongated shape, wherein the individual sub-electrodes of each electrode divided into individual sub-electrodes are arranged transversely to the axial direction of the bending actuator, next to and with clearance from one another.

9. A piezoelectric actuator device according to claim 1, wherein the at least one piezoelectric body is a single part and is made in one piece.

10. A piezoelectric actuator device according to claim 1, wherein the piezoelectric body is mounted on a piezoelectrically inactive.

11. A piezoelectric actuator device according to claim 10, wherein the piezoelectrically inactive substrate has electrically conductive properties and directly forms a unitary electrode of the electrode unit.

12. A piezoelectric actuator device according to claim 1, wherein each sub-electrode pair is contacted by a separate electrical supply lead serving for electrical charge transfer and containing the assigned current-limiting resistor connected in series.

13. A piezoelectric actuator device according to claim 1, further comprising a voltage source to provide a drive voltage allowing actuation of the at least one piezoelectric transducer and which is connected simultaneously to all sub-electrode pairs.

14. A piezoelectric actuator device according to claim 13, wherein all sub-electrode pairs are supplied with current from the same voltage source, so that the same drive voltage may be applied to all sub-electrode pairs simultaneously.

15. A valve for controlling a fluid, with a piezoelectric actuator device containing at least one piezoelectric transducer, which has at least one piezoelectric body and an electrode unit assigned to this piezoelectric body, wherein the electrode unit comprises two electrodes mounted on opposite sides of the piezoelectric body and has an overall capacitance, wherein the piezoelectric transducer forms a valve member or a drive element for a valve member, wherein at least one of the two electrodes of the electrode unit is divided into several individual sub-electrodes spaced apart from one another and forming with the electrode lying opposite several sub-electrode pairs each defining a partial capacitance of the overall capacitance, wherein a separate current-limiting resistor active during charge flow is connected in series to each sub-electrode pair.

16. A valve according to claim 15, wherein only one of the two electrodes of the electrode unit is divided into several individual sub-electrodes, spaced apart from one another, while the other electrode lying opposite is a unitary electrode and electrode sections of the unitary electrode lying opposite the individual sub-electrodes contribute to forming a sub-electrode pair in each case.

17. A valve according to claim 15, wherein both electrodes of the electrode unit are divided into several individual sub-electrodes, spaced apart from one another, wherein individual sub-electrodes of both electrodes lie opposite in pairs to form sub-electrode pairs.

18. A valve according to claim 17, wherein the two electrodes are divided into an equal number of individual sub-electrodes, wherein each individual sub-electrode of the one electrode lies opposite an individual sub-electrode of the other electrode to form a sub-electrode pair.

19. A valve according to claim 17, wherein the individual sub-electrodes lying opposite one another to form a sub-electrode pair are in each case of equal size.

20. A valve according to claim 15, wherein the individual sub-electrodes belonging to the same electrode lie in a common plane.

21. A valve according to claim 15, wherein the individual sub-electrodes of each electrode divided into individual sub-electrodes are strip-shaped and arranged next to one another on the long side and with lateral clearance.

22. A valve according to claim 15, wherein the piezoelectric transducer is in the form of a bending actuator with an elongated shape, wherein the individual sub-electrodes of each electrode divided into individual sub-electrodes are arranged transversely to the axial direction of the bending actuator, next to and with clearance from one another.

23. A valve according to claim 15, wherein the at least one piezoelectric body is a single part and is made in one piece.

24. A valve according to claim 15, wherein the piezoelectric body is mounted on a piezoelectrically inactive substrate.

25. A valve according to claim 24, wherein the piezoelectrically inactive substrate has electrically conductive properties and directly forms a unitary electrode of the electrode unit.

26. A valve according to claim 15, wherein each sub-electrode pair is contacted by a separate electrical supply lead serving for electrical charge transfer and containing the assigned current-limiting resistor connected in series.

27. A valve according to claim 15, further comprising a voltage source to provide a drive voltage allowing actuation of the at least one piezoelectric transducer and which is connected simultaneously to all sub-electrode pairs.

28. A valve according to claim 27, wherein all sub-electrode pairs are supplied with current from the same voltage source, so that the same drive voltage may be applied to all sub-electrode pairs simultaneously.

29. A valve according to claim 24, wherein the piezoelectrically inactive substrate is spring-elastic.

30. A piezoelectric actuator device according to claim 10, wherein the piezoelectrically inactive substrate is spring-elastic.

* * * * *